(12) United States Patent
Aoyama et al.

(10) Patent No.: US 8,047,418 B2
(45) Date of Patent: Nov. 1, 2011

(54) SOLDERING APPARATUS AND METHOD

(75) Inventors: Nobuyuki Aoyama, Kobe (JP); Kenshi Ikedo, Kobe (JP); Akira Okuno, Kobe (JP); Masato Arita, Tokyo (JP)

(73) Assignees: Fujitsu Ten Limited, Kobe (JP); Sensbey Co., Ltd., Yokohama (JP)

( * ) Notice: Subject to any disclaimer, the term of this patent is extended or adjusted under 35 U.S.C. 154(b) by 412 days.

(21) Appl. No.: 12/096,052

(22) PCT Filed: Dec. 8, 2006

(86) PCT No.: PCT/JP2006/324989
§ 371 (c)(1),
(2), (4) Date: Sep. 15, 2008

(87) PCT Pub. No.: WO2007/069705
PCT Pub. Date: Jun. 21, 2007

(65) Prior Publication Data
US 2010/0264197 A1    Oct. 21, 2010

(30) Foreign Application Priority Data

Dec. 12, 2005  (JP) ................. 2005-357940

(51) Int. Cl.
*B23K 1/08* (2006.01)
*B23K 37/00* (2006.01)
*B23K 37/04* (2006.01)
*B23K 3/06* (2006.01)

(52) U.S. Cl. ........ 228/37; 228/47.1; 228/49.5; 228/56.1
(58) Field of Classification Search ............. 228/180.1, 228/179.1, 259, 260, 261, 37, 56.1
See application file for complete search history.

(56) References Cited

U.S. PATENT DOCUMENTS

| | | | |
|---|---|---|---|
| 3,828,419 A * | 8/1974 | Wanner | 228/36 |
| 4,311,266 A * | 1/1982 | Kondo | 228/40 |
| 5,044,542 A * | 9/1991 | Deambrosio | 228/37 |
| 5,048,746 A * | 9/1991 | Elliott et al. | 228/180.1 |
| 5,121,874 A * | 6/1992 | Deambrosio et al. | 228/219 |
| 5,176,307 A * | 1/1993 | Hagerty et al. | 228/37 |

(Continued)

FOREIGN PATENT DOCUMENTS
GB     801510     11/2005

(Continued)

OTHER PUBLICATIONS

"Denshi Gijutsu" extra edition of Jun. 1981 issue (vol. 23, No. 7, 1981)—p. 1, [0003]. Denshi Gijutsu, Extra Edition of Jun. 1981 Issue (vol. 23, No. 7, 1981), 17 pages (Non-English Information). See, Explanation of Relevance submitted herewith.

*Primary Examiner* — Kiley Stoner
*Assistant Examiner* — Carlos Gamino
(74) *Attorney, Agent, or Firm* — Baker & Hostetler LLP

(57) ABSTRACT

A soldering apparatus including a vessel containing a molten solder, a casing defining therewithin a soldering chamber in which a flat overflowing wave of the molten solder is formed, a conveyor physically integrated with the casing for movement therewith and operable for transferring a printed circuit board through the soldering chamber, actuators and for vertically moving the casing, inert gas feeders for feeding an inert gas to the soldering chamber, and a controller for controlling the operation of the actuators and, so that the printed circuit board is contacted with the surface of the flat overflowing wave in an atmosphere of the inert gas during its passage through the soldering chamber.

7 Claims, 11 Drawing Sheets

U.S. PATENT DOCUMENTS

| | | | |
|---|---|---|---|
| 5,203,489 A * | 4/1993 | Gileta et al. | 228/219 |
| 5,433,368 A * | 7/1995 | Spigarelli | 228/8 |
| 5,611,480 A * | 3/1997 | Ciniglio et al. | 228/180.1 |
| 5,782,400 A * | 7/1998 | Susicki | 228/49.5 |
| 6,138,481 A * | 10/2000 | Saito et al. | 65/537 |
| 6,655,574 B2 * | 12/2003 | Schouten et al. | 228/37 |
| 6,688,511 B2 * | 2/2004 | Hildenbrand et al. | 228/102 |
| 6,761,301 B2 * | 7/2004 | Mukuno et al. | 228/42 |
| 7,150,387 B2 * | 12/2006 | Yamaguchi et al. | 228/46 |

FOREIGN PATENT DOCUMENTS

| | | | |
|---|---|---|---|
| JP | 6-198486 | | 7/1994 |
| JP | 07-336036 | | 12/1995 |
| JP | 2003-179340 | | 6/2003 |
| JP | 2005-203406 A | | 7/2005 |
| JP | 2007109959 A | * | 4/2007 |
| WO | 91/07248 A1 | | 5/1991 |

* cited by examiner

FIG. 2
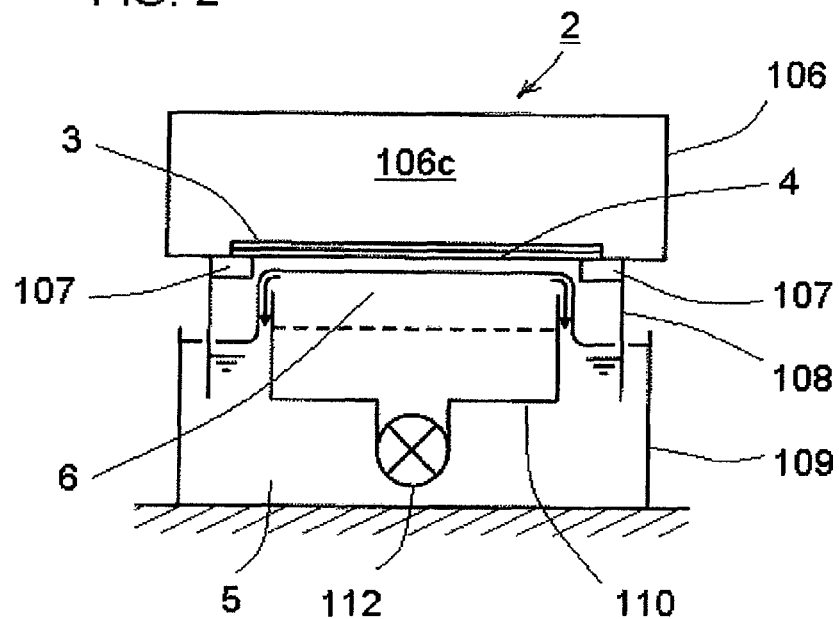
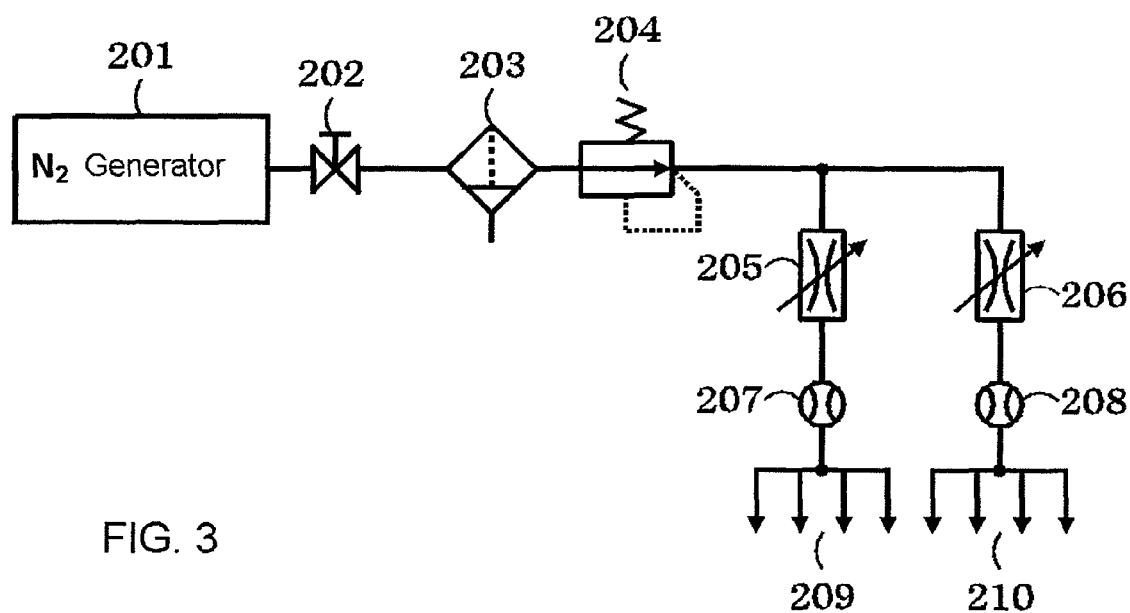
FIG. 3

SOLDERING APPARATUS AND METHOD

CROSS REFERENCE

This is a U.S. national phase application under 35 U.S.C. 371 of International Application PCT/JP2006/324989(not published in English), filed Dec. 8, 2006.

TECHNICAL FIELD

The present invention relates to apparatus and method for soldering a flat work piece by a flow dip method in which the work piece is brought into contact with a flat overflowing wave.

BACKGROUND ART

As methods for soldering a printed circuit board having electronic parts such as leads and terminals mounted thereon, various methods, such as a flat dip method, a dual pot method, a flow method, a wave method, a double wave method, a flow-dip method and a cascade method, are known for supplying a molten solder onto the electronic parts to be soldered and the soldering lands, that is, the regions to be soldered on the printed circuit board.

Such soldering methods are described in "Denshi Gijutsu, extra edition of the June 1981 issue (Vol. 23, No. 7, 1981)" (Document 1). In Document 1, the flow-dip method is explained to have features of both of the flow or wave method and dip method. That is, in the flow-dip method, a molten solder in a solder vessel is caused to overflow by a pump to form an overflowing wave as in the flow or wave method, and a printed circuit board is transferred and dipped in the overflowing wave to carry out soldering as in the dip method.

As described in Document 1, the flow-dip method is useful for soldering parts with long leads, because the temperature of the molten solder is stable and does not drop when the printed circuit board is brought into contact with a surface of the molten solder, and because the surface of the molten solder can be always kept clean and the surface of the overflowing wave is stable. Another reason is that even long leads of the parts do not have the possibility of contacting the edges of the discharge opening from which the molten solder overflows.

U.S. Pat. No. 4,512,510 (Document 2) discloses a method for improving the quality of soldering by the flow-dip method. In this method, when a printed circuit board is brought into contact with a surface of a molten solder, the printed circuit board is tilted so that the printed circuit board can be gradually brought into contact with the molten solder from one end to the other to permit a gas between the printed circuit board and the surface of the molten solder to escape. The printed circuit board is then moved along the surface of the molten solder to apply a kinetic pressure from the molten solder to the regions to be soldered so that the regions to be soldered can be fully wetted with the molten solder. Finally, the printed circuit board is gradually separated from the surface of the molten solder from one end to the other so that an appropriate amount of solder can remain on each region to be soldered by a peel back effect and a solder bridge cannot be formed between adjacent regions to be soldered.

Japanese Unexamined Patent Publication No. H6-198486 (Document 3) discloses a soldering method in which soldering is carried out in an atmosphere of a non-oxidizing inert gas such as nitrogen gas. In an inert gas atmosphere with a low oxygen concentration, because oxidation of the regions to be soldered can be prevented. Further, because the surface tension of the molten solder is decreased and, therefore, the wettability of the regions to be soldered to the molten solder is significantly improved, the molten solder can be supplied onto minute regions to be soldered so easily that what is called micro-soldering can be carried out. Additionally, since the amount of flux to be applied on the regions to be soldered can be significantly reduced, there is no need for washing of the printed circuit board (removal of residual flux) after soldering.

The method disclosed in Document 3 is exclusively applied to a flow method, a wave method, a double wave method or a cascade method in which the printed circuit board is transferred only linearly, since a conveyor can be easily installed in a chamber maintained in an inert gas atmosphere. Therefore, there has been no soldering apparatus employing a flow-dip method in which soldering is carried out in an inert gas atmosphere, since a complicated transfer means is required to transfer the printed circuit board not only horizontally but also vertically.

More specifically, in order to provide a complicated transfer means as described in Document 3 in a chamber maintained in an inert gas atmosphere, the chamber must have an extremely large volume. Thus, the inert gas feed rate must be significantly large to achieve an intended low oxygen concentration (1000 ppm, for example).

Even if a soldering apparatus having such a transfer means provided outside a chamber maintained in an inert gas atmosphere is realized, the chamber will have a large capacity to permit the printed circuit board to move up and down and, further, outside air will enter the chamber from where a part of the transfer means extends into the chamber. Therefore, the inert gas feed rate must be significantly large to maintain an intended oxygen concentration. A large inert gas feed rate leads to an increase in the cost of soldering.

In addition, soldering of a printed circuit board having parts with long leads mounted thereon, that is, a printed circuit board having a surface to be brought into contact with molten solder (a surface to be soldered) from which long leads protrudes cannot be carried out by the apparatus disclosed in Document 3. Soldering of such a printed circuit board cannot be carried out by a method other than a dip or flow-dip method. However, there is no soldering apparatus employing a flow-dip method which can carry out soldering in an inert gas atmosphere with a low oxygen concentration at a low cost for the same reason as described above.

When electronic parts with long leads such as connectors are soldered onto a printed circuit board which has been once subjected to reflow soldering, partial soldering is carried out by a flow-dip method using a mask plate having openings at positions corresponding to the regions to be soldered (see FIG. 5(b)). However, there is no soldering apparatus which can carry out soldering by a flow-dip method in an inert gas atmosphere with a low oxygen concentration for the same reason as described above. The soldering is carried out by a soldering iron robot while blowing nitrogen gas onto the regions to be soldered. Therefore, the soldering of such connectors yields low productivity.

British Patent No. 801510 (Document 4) discloses what is called a Sylvania system, in which solder is pumped continuously to a plurality of upwardly extending tubes and ejected therefrom. An article to be soldered is moved into position to touch the solder ejected from selected numbers of the tubes so that selected regions on the article are soldered.

The Sylvania method disclosed in Document 4 has the following drawbacks.

(1) The mechanism of the system is so complicated that adjustment of the mechanism or recovery from a failure takes a significant amount of time, resulting in low productivity.

(2) Since different types of tubes must be used for different types of printed circuit boards to be soldered and it takes long time (about 60 minutes) to exchange the tubes. Thus, the downtime of the soldering apparatus is long, resulting in low productivity.

(3) Since there are many tubes, it takes long time (about 30 minutes, for example) to clean the tubes, resulting in low productivity.

(4) The tubes are very expensive (about one million yen per one tube, for example).

(5) It is difficult to perform the soldering in an inert gas atmosphere in a simple manner.

DISCLOSURE OF THE INVENTION

The present invention has been made to overcome the above problems, and it is, therefore, an object of the present invention to provide a flow-dip soldering apparatus which can carry out flow-dip soldering at a low feed rate, that is, with low consumption, of an inert gas such as nitrogen gas.

Another object of the present invention is to provide a soldering apparatus which permits high quality soldering at low costs, even when electronic parts mounted on a printed circuit board have long leads or even when partial soldering using a mask plate is carried out.

It is a further object of the present invention to provide a soldering method which can carry out soldering in an inert gas atmosphere with a low oxygen concentration with high productivity.

In accordance with one aspect of the present invention there is provided an apparatus for soldering a flat work piece having a lower surface to be soldered, comprising:

a solder vessel containing a molten solder;

a solder-overflowing pot disposed in said solder vessel and having a discharge opening above a surface level of the molten solder, said solder-overflowing pot being configured to form a flat overflowing wave of the molten solder above said discharge opening, said discharge opening having a dimension greater than that of the work piece so that entire lower surface of the work piece can simultaneously contact with a surface of said flat overflowing wave;

a casing extending above said solder vessel from a rear end to a fore end and defining therewithin a soldering chamber, said casing having an inlet opening at said rear end to permit the work piece to enter said soldering chamber therethrough and an outlet opening at said fore end to permit the work piece to exit said soldering chamber therethrough, said casing having a lower opening facing said discharge opening of said solder-overflowing pot, said casing having a skirt extending contiguously downward from a whole marginal edge of said lower opening to surround said solder-overflowing pot, said skirt cooperating with said molten solder-containing vessel to seal said soldering chamber such that the soldering chamber is permitted to be in gas communication with an outside atmosphere only through said inlet and outlet openings;

a conveyor disposed within said soldering chamber and physically integrated with said casing for movement therewith, said conveyor being operable for transferring the work piece between said inlet opening and said outlet opening;

one or more inert gas feeders for feeding an inert gas to said soldering chamber;

drive means operable to vertically move said integrated conveyor and casing between an upper position in which the work piece can be received by said conveyor through said inlet opening and can be discharged from said conveyor through said outlet opening and a lower position in which the work piece can contact with the surface of said flat overflowing wave during the positioning thereof above said discharge opening; and a controller for controlling the operation of said drive means and the operation of said conveyor so that the work piece is received through said inlet opening by said conveyor in said upper position, contacted with the surface of said flat overflowing wave during the positioning thereof above said discharge opening by said conveyor in said lower position and discharged through said outlet opening from said soldering chamber by said conveyor in said upper position.

In another aspect, the present invention provides method for soldering a flat work piece having a lower surface to be soldered, comprising:

providing a soldering apparatus which comprises a solder vessel containing a molten solder, a solder-overflowing pot disposed in said solder vessel and having a discharge opening above a surface level of the molten solder, said discharge opening having a dimension greater than that of the work piece so that the entire lower surface of the work piece can simultaneously contact with a surface of said flat overflowing wave, a casing defining therewithin a soldering chamber and having a skirt extending to surround said solder-overflowing pot, said skirt cooperating with said molten solder-containing vessel to seal said soldering chamber such that the soldering chamber is permitted to be in gas communication with an outside atmosphere only through said inlet and outlet openings, and a conveyor disposed within said soldering chamber and physically integrated with said casing for movement therewith;

causing the molten solder in said solder vessel to overflow from said discharge opening to form a flat overflowing wave of the molten solder above said discharge opening;

feeding an inert gas to said solder chamber to maintain said solder chamber in an atmosphere of the inert gas; and transferring the work piece by said conveyor above said discharge opening while displacing said casing downward to bring the lower surface of the work piece into contact with a surface of said overflowing wave.

BRIEF DESCRIPTION OF DRAWINGS

The present invention will be described in detail below with reference to the accompanying drawings, in which:

FIG. 2 is a cross-sectional view taken along the line II-II in FIG. 1;

FIG. 3 is piping diagram of a nitrogen gas feeding system provided in the constitution shown in FIG. 1;

DETAILED DESCRIPTION OF THE PREFERRED EMBODIMENTS OF THE INVENTION

A soldering apparatus according to the present invention is adapted to carry out flow-dip soldering of a flat work piece in an atmosphere of an inert gas and is implemented as follows. In general, a soldering process includes a flux applying step, a preheating step and a soldering step as well known in the art. In the following, the description is focused mainly on the soldering step, to which the constitution of the present invention is applied.

Figure 1:
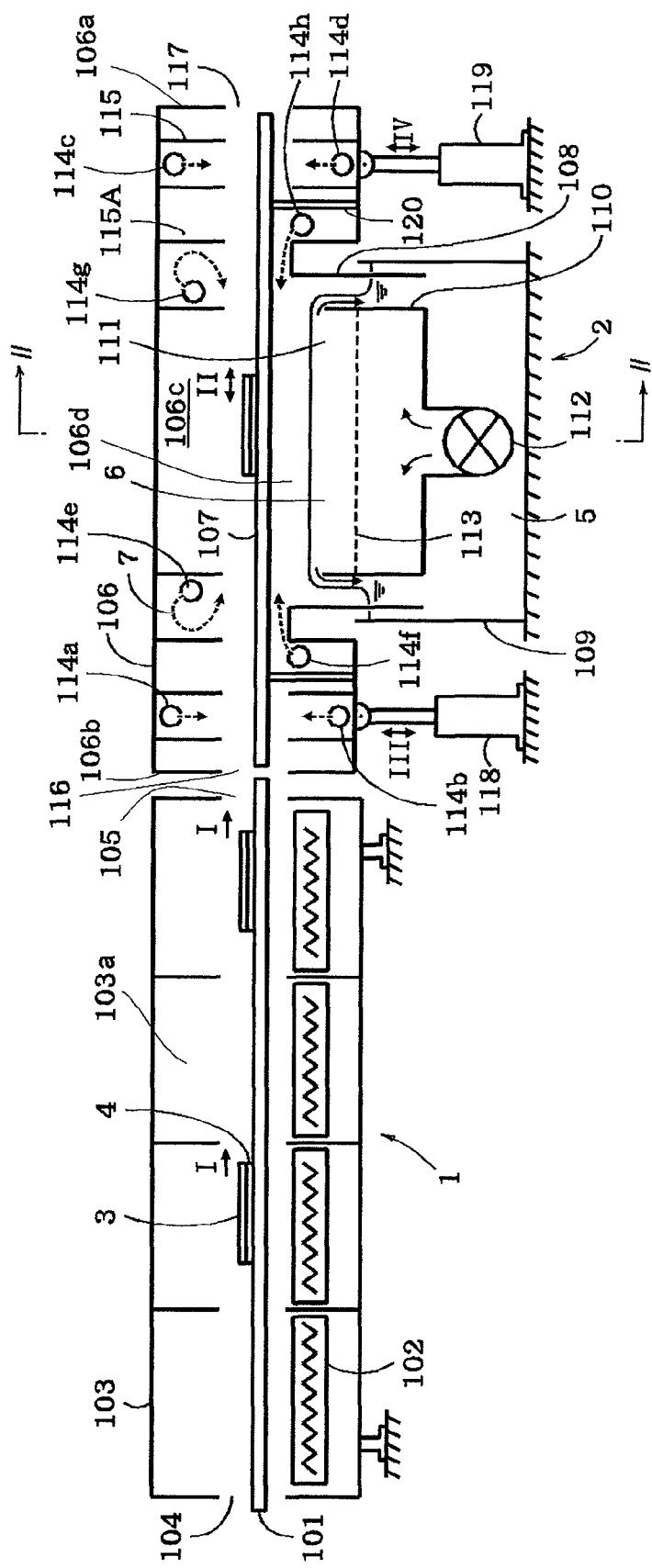
FIG. 1 is an elevational cross-sectional view schematically illustrating an embodiment of a soldering apparatus according to the present invention.

As shown in FIG. 1, the soldering apparatus of this embodiment has a preheating section 1 and a soldering section 2.

The preheating section 1 has a case 103 defining therewithin a preheating chamber 103a. The case 103 is a means for promoting uniform preheating of a printed circuit board 3 as a work piece to be soldered and has an inlet opening 104 and an outlet opening 105.

The preheating chamber 103a is divided into four heating zones each having a heater 102 using infrared rays, hot air or a combination of such heating means. The surface temperature of the infrared heaters or the hot air temperature from the hot air heaters for use as the heaters 102 can be selected and set through a temperature controller (not shown).

Figure 6:
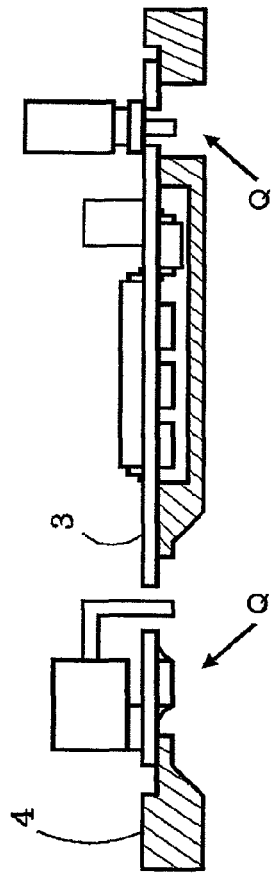
FIG. 6 is a cross-sectional view illustrating a printed circuit board with a mask plate fitted thereon.
Figure 7A:
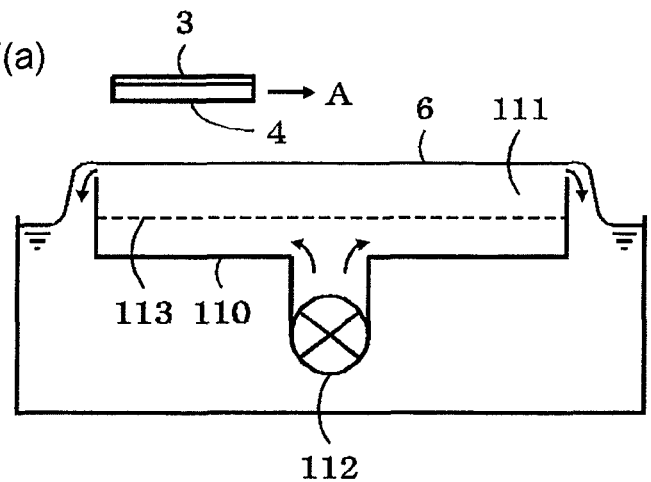
FIG. 7(*a*) to FIG. 7(*d*) are views illustrating how a printed circuit board is moved vertically and horizontally (with respect to the flat overflowing wave) and brought into contact with the flat overflowing wave.
Figure 7B:
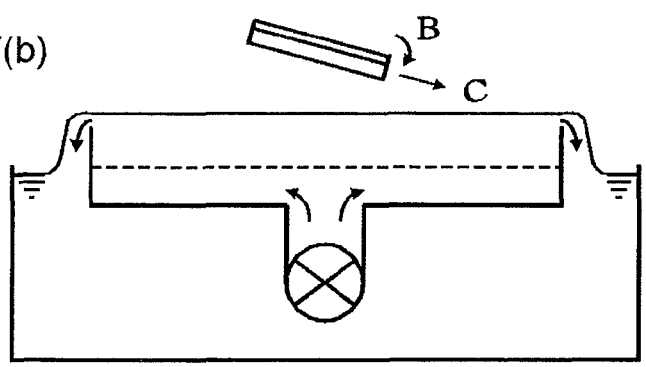
Figure 7C:
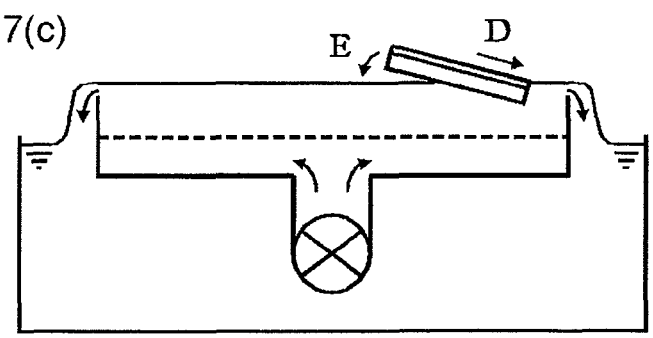
Figure 7D:
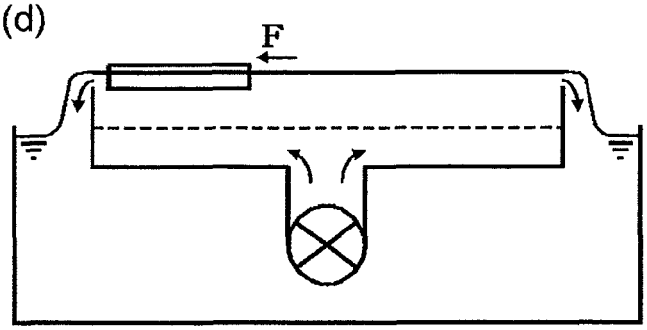

The preheating section 1 has a conveying device 101 disposed in the preheating chamber 103a for transferring the printed circuit board 3 through the preheating chamber 103a in the direction of arrows I so that the printed circuit board 3 is preheated during the passage through the preheating chamber 103a. The start, stop, speed and so on of the conveying device 101 are controlled by a controller, which will be described in detail later. Designated as 4 is a mask plate, which is used when the printed circuit board 3 is subjected to spot or partial soldering. The detail of the mask plate 4 is shown in FIG. 6.

The soldering section 2 has a solder vessel 109 containing a molten solder 5, which is maintained in a molten state at a prescribed temperature by a heater, a temperature sensor, and a temperature controller (not shown). Disposed in the solder vessel 109 are a solder-overflowing pot 110 having a discharge opening 111 above the surface level of the molten solder 5 in the solder vessel 109, and a pump 112 for supplying the molten solder 5 in the solder vessel 109 to the solder-overflowing pot 110. When the molten solder 5 is supplied to the solder-overflowing pot 110 by the pump 119, the molten solder 5 overflows from the discharge opening 111 to form a flat overflowing wave 6 above the discharge opening 111. Although the molten solder 5 is shown to be overflowing from the discharge opening 111 in four directions in the drawings, the molten solder 5 may overflow in any desired direction. Thus, the molten solder may overflow in three or two directions or only in one direction. The discharge opening 111 of the solder-overflowing pot 110 has a dimension greater than that of the printed circuit board 3 so that the entire lower surface of the printed circuit board 3 can simultaneously contact with a surface of the flat overflowing wave 6. Designated as 113 is a straightening plate (flow controlling plate) for smoothing the flow of the molten solder 5.

The soldering section 2 also has a casing 106 and a conveyor 107. The casing 106 extends above the solder vessel 109 from a fore end 106a to a rear end 106b and defines therewithin a soldering chamber 106c which is maintained in an inert gas atmosphere, for example, a nitrogen gas atmosphere. The casing 106 has an inlet opening 116 at the rear end 106b to permit the printed circuit board 3 to enter the soldering chamber 106c therethrough, an outlet opening 117 at the fore end 106a to permit the printed circuit board 3 to exit the soldering chamber 106c therethrough. The casing 106 has a lower opening 106d facing the discharge opening 111 of the solder-overflowing pot 110 at the bottom, and a skirt 108 extending contiguously downward from a whole marginal edge of the lower opening 106d. The conveyor 107 is operable for transferring the printed circuit board 3 between the inlet and outlet openings 116 and 117 of the casing 106. The conveyor 107 is supported by support members 120 to the casing 106 and physically integrated with the casing 106 for movement therewith. The skirt 108 surrounds the solder-overflowing pot 110 and extends into the molten solder 5 in the solder vessel 109 to seal the soldering chamber 106c such that the soldering chamber 106c is permitted to be in gas communication with an outside atmosphere only through the inlet and outlet openings 116 and 117.

Figure 14:
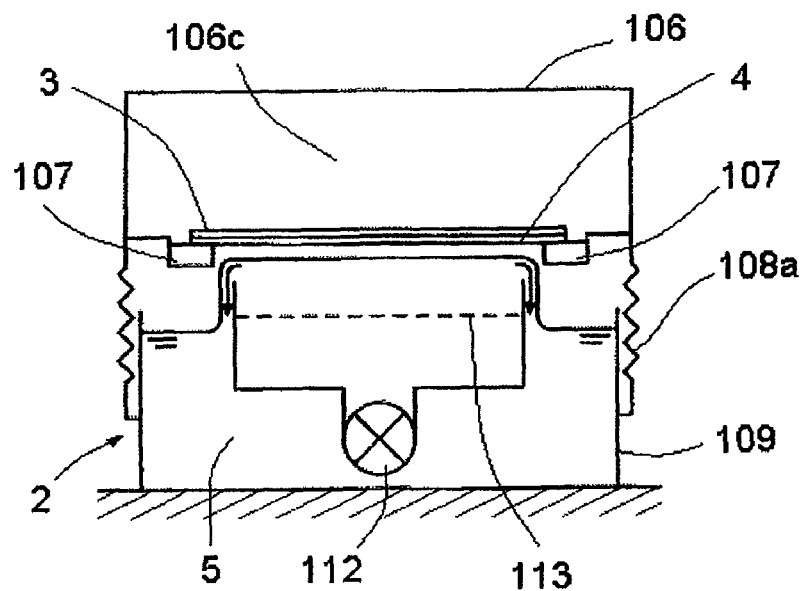
FIG. 14 is an elevational cross-sectional view schematically illustrating a further embodiment of a soldering apparatus according to the present invention.
Figure 15:
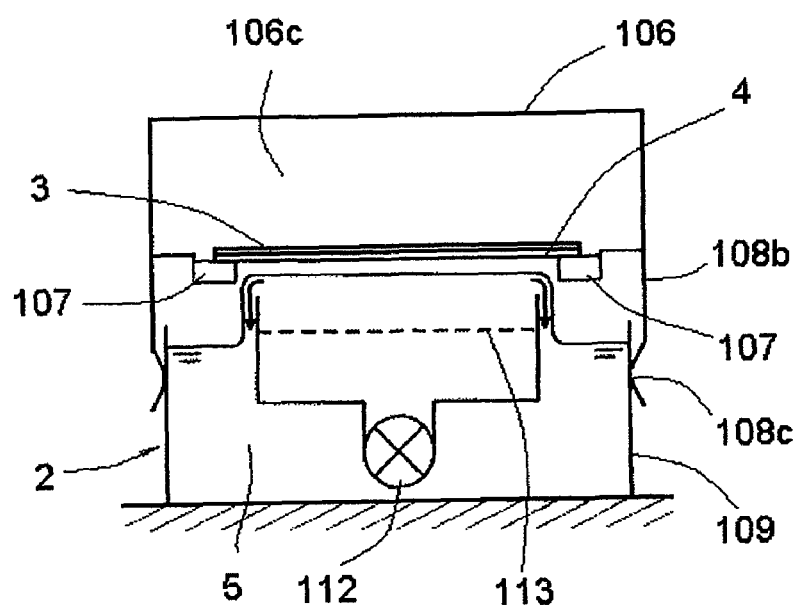
FIG. 15 is an elevational cross-sectional view schematically illustrating a still further embodiment of a soldering apparatus according to the present invention.

The casing 106 is not limited to the above configuration as long as the soldering chamber 106c is properly sealed between the casing 106 and the solder vessel 109. FIG. 14 and FIG. 15 show other examples of such a sealing configuration. In the example shown in FIG. 14, the casing 106 has, instead of the skirt 108, a bellows 108a extending downward from the solder vessel 109 and has a lower end secured to the solder vessel 109 to seal the soldering chamber 106c. In the example shown in FIG. 15, a skirt 108b provided with a plate spring 108c at its lower end extends downward along the outer walls of the solder vessel 109. The plate spring 108c is in slidable contact with the outer walls of the solder vessel 109 and urged toward the solder vessel 109 to seal the soldering chamber 106c.

As the pump 112, a centrifugal pump which is rotatably driven by a motor 304 (see FIG. 4) is used, and the rotational speed of the motor is controlled by the controller 301. An electromagnetic pump may be used as the pump 112. When a means utilizing potential energy as disclosed in Japanese Unexamined Patent Publication No. S53-57156 is used as the means for supplying the molten solder 5 into the solder-overflowing pot 110, the height and the surface state of the flat overflowing wave 6 can be further stabilized.

In order to produce an inert gas atmosphere in the soldering chamber 106c, a plurality of (8 in the example shown in FIG. 1) nitrogen gas feeding nozzles 114a to 114h are provided in the casing 106. In the soldering chamber 106c, along the conveyor 107, that is, in the direction in which the printed circuit board 3 is transferred, are arranged a plurality of baffle plates 115 extending in a direction perpendicular to the direction in which the printed circuit board 3 is transferred to form a labyrinth seal so that outside atmosphere is less likely to enter the soldering chamber 106c through the inlet and outlet openings 116 and 117 and the atmosphere in the soldering chamber 106c is less likely from flowing out of the soldering chamber 106c through the inlet and outlet openings 116 and 117. In particular, many of the baffle plates 115 are provided in sections close to the inlet and outlet openings 116 and 117 to form labyrinth sealed sections 115A. Curtains may be suspended from the ends of the baffle plates 115 to reduce the opening area of the inlet and outlet openings 116 and 117 in order to enhance the function of the labyrinth sealed sections 115A.

The soldering section 2 has a first actuator 118 operatively connected to the casing 106 at a position adjacent to the rear end 106b for vertically displacing the rear end 106b, and a second actuator 119 operatively connected to the casing 106 at a position adjacent to the fore end 106a for vertically displacing the fore end 106a. The controller 301 controls the first and second actuators 118 and 119 to move the casing 106 including the conveyor 107 vertically between an upper position in which the printed circuit board 3 can be received by the conveyor 107 through the inlet opening 116 and can be discharged from the conveyor 107 through the outlet opening 117 and a lower position in which the printed circuit board 3 can contact with the surface of the flat overflowing wave 6 during the positioning thereof above the discharge opening 111. Therefore, the length of the skirt 108 of the casing 106 is selected such that the skirt 108 does not come out of the molten solder 5 in the solder vessel 109 when the casing 106 is in the upper position. Also, the controller 301 controls the first and second actuators 118 and 119 independently (in the directions indicated by the arrows III and IV, respectively) so that the printed circuit board 3 on the conveyor 107 can land on and take off from a surface of the flat overflowing wave 6 of the molten solder 5 in any desired tilted state.

The conveyor 107 of the soldering section 2 transfers the printed circuit board 3 in the directions as indicated by the double-headed arrow II, and the start, stop, direction, speed and so on of the conveyor 107 are controlled by the controller 301.

FIG. 3 is a piping diagram of a nitrogen gas feeding system provided in the constitution shown in FIG. 1.

In FIG. 3, designated as 201 is a nitrogen gas generator. As shown in FIG. 3, nitrogen gas fed from the nitrogen gas generator 201 through an on-off valve 202 is subjected to removal of impurities by a filter 203, and is pressurized to a predetermined constant pressure by a pressure control valve 204. The nitrogen gas is then fed to a passage to a first nozzle group 209 consisting of four nozzles 114a to 114d arranged in the vicinity of the inlet and outlet openings 116 and 117 through a flow control valve 205 and a flowmeter 207 and a passage to a second nozzle group 210 consisting of four nozzles 114e to 114h arranged in the vicinity of the solder vessel 10 through a flow control valve 206 and a flowmeter 208. The flow control valves 205 and 206 are remotely controlled by the controller 301.

Figure 4:
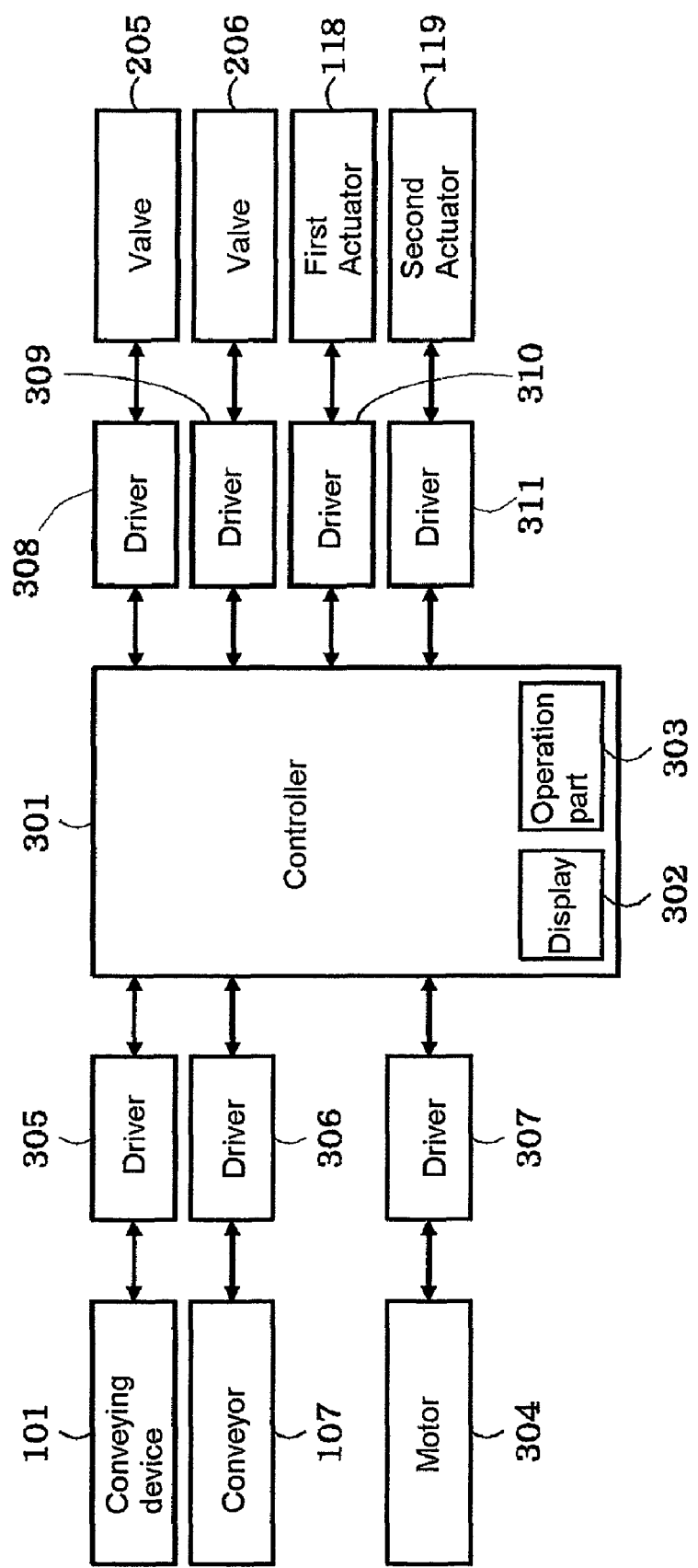
FIG. 4 is a block diagram of a primary control system provided in the constitution shown in FIG. 1.

FIG. 4 is a block diagram illustrating a primary control system provided in the constitution shown in FIG. 1. The same parts as those in FIGS. 1 and 3 are designated in FIG. 4 by the same reference numerals.

As shown in FIG. 4, the controller 301, which is constituted of a computer system, controls the operations of the conveying device 101, the conveyor 107, and the first and second actuators 118 and 119 so that the printed circuit board 3 is received through the inlet opening 116 by the conveyor 107 in the upper position, contacted with the surface of the flat overflowing wave 6 during the positioning thereof above the discharge opening 111 by the conveyor 107 in the lower position and discharged through the outlet opening 117 from the soldering chamber 106c by the conveyor 107 in the upper position. The controller 301 also controls the flow control valves 205 and 206 to increase or decrease the feed rate of the inert gas fed to the soldering chamber 106c in response to a vertical movement of the casing 106, and controls the motor 304 for the pump 112. The controller 301 has a CPU, a RAM, a ROM, an external storage device, input-output ports (which are not shown) and so on. The CPU of the controller 301 loads software stored in the ROM or the external storage device into the RAM and executes the software to perform the control functions.

The controller 301 also has a display 302 such as an LCD and a command operation part 303 such as a keyboard or mouse. The controller 301 controls the operations of the conveying device 101, the conveyor 107, the first and second actuators 118 and 119, the flow control valves 205 and 206, and the motor 304 for the pump 112 from the input-output ports via drivers 305 to 311, respectively.

Each of the drivers 305 to 311 is constituted of an electric drive circuit when its controlling object is an electric device and of a fluid drive circuit when its controlling object is a fluid pressure actuator using pneumatic or hydraulic pressure. Each of the input-output ports of the controller 301 and the drivers 305 to 311 has a two-way interface so that the controller 301 can communicate with the drivers 305 to 311 to transmit a target control amount thereto and receive the current control amount therefrom. Each of the controlling object as described above (the conveying device 101, the conveyor 107, the first and second actuators 118 and 119, the flow control valves 205 and 206 and the motor 304 for the pump 112) has a sensor for detecting the current control amount. The drivers 310 and 311 and the first and actuators 118 and 119 constitute the driving means operable to vertically move the integrated conveyor 107 and casing 106 between the upper and lower positions.

Figure 5:
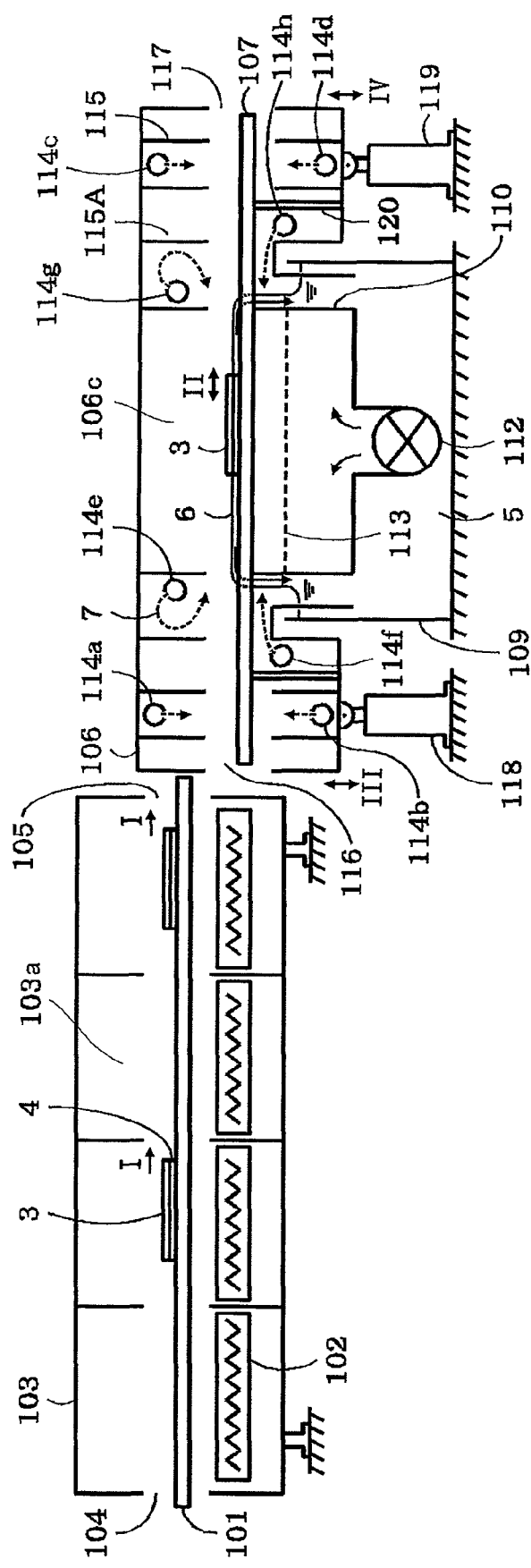
FIG. 5 is an elevational cross-sectional view schematically illustrating the operation at the time of soldering in the soldering apparatus shown in FIG. 1.

FIG. 5 schematically depicts the operation at the time of soldering in the soldering apparatus shown in FIG. 1. FIG. 5 illustrates the state in which the casing 106 has been moved down to the lower position and the printed circuit board 3 is in contact with the flat overflowing wave 6. Even in this state, the conveyor 107 can be driven to move (reciprocate) the printed circuit board 3 in the directions indicated by the double-headed arrow II.

Since the case 103 of the preheating section 1 and the casing 106 of the soldering section 2 are separated and since the conveyor 107 and the casing 106 of the soldering section 2 are configured to move together as shown in FIG. 5, flow-dip soldering of the printed circuit board 3 can be carried out without increasing the volume of the soldering chamber 106c.

Thus, there is no need to increase the feed rate of nitrogen gas to be fed to the soldering chamber 106c, and it is only necessary to feed nitrogen gas in a small amount commensurate with the volume of the soldering chamber 106c. Therefore, flow-dip soldering in an inert gas atmosphere with a low oxygen concentration can be carried out with low running costs.

FIG. 6 is a view illustrating a printed circuit board 3 on which a mask plate 4 is fitted to carry out partial soldering.

When spot flow soldering is required, the printed circuit board 3 is introduced into the soldering apparatus on a pallet (mask plate) 4 having cutouts at positions corresponding to the regions to be soldered (indicated by the arrows Q) on the printed circuit board 3 as shown in FIG. 6 so that the molten solder is supplied only to the selected parts or regions that need soldering.

Figure 8A:
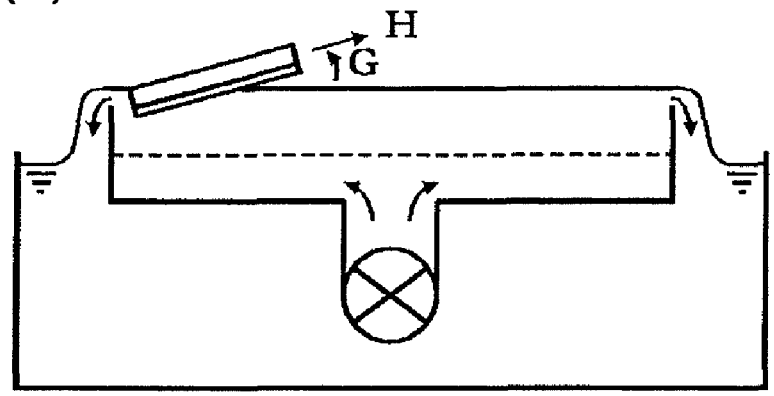
FIG. 8(a) to FIG. 8(c) are views illustrating how a printed circuit board is taken off from the flat overflowing wave.
Figure 8B:
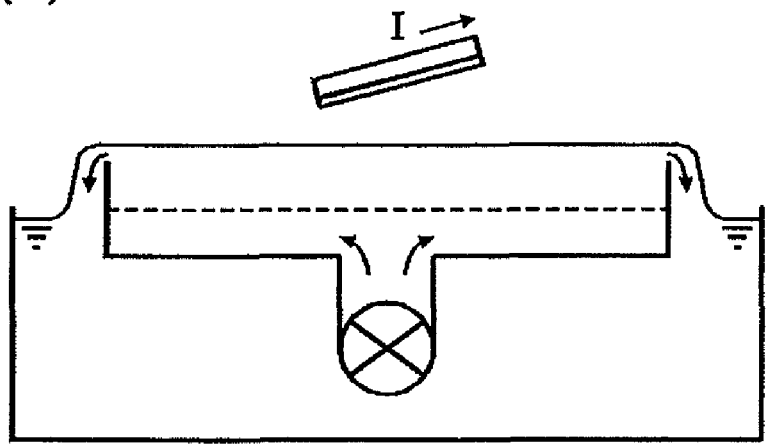
Figure 8C:
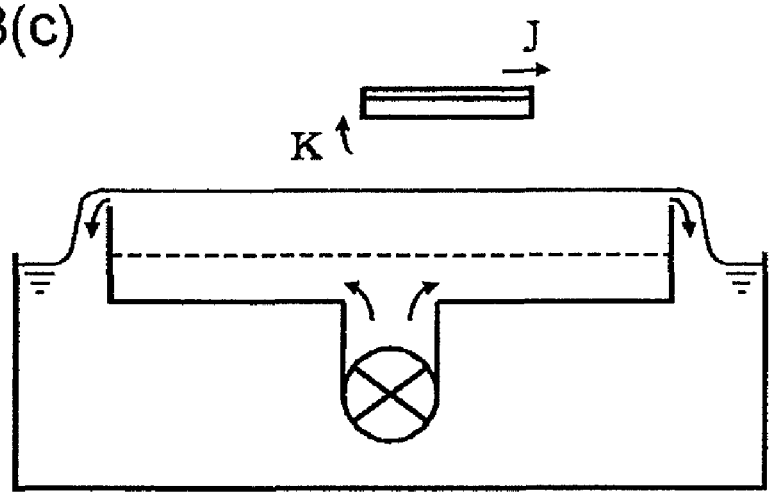

FIG. 7(*a*) to and FIG. 7(*d*) are views illustrating how the printed circuit board 3 is moved vertically and horizontally (with respect to the flat overflowing wave 6) and brought into contact with the flat overflowing wave 6 to carry out soldering, while FIG. 8(*a*) to and FIG. 8(*c*) are views illustrating how the printed circuit board 3 is taken off from the flat overflowing wave 6.

The vertical movement of the printed circuit board 3 is made by the first and second actuators 118 and 119 shown in FIG. 1 and FIG. 5, and the horizontal movement of the printed circuit board 3 is made by the conveyor 107 shown in FIG. 1 and FIG. 5. The direction, distance and speed of the movement are controlled by the controller 301 shown in FIG. 4.

FIG. 7(*a*) to FIG. 7(*d*) and FIG. 8(*a*) to FIG. 8(*c*) illustrate sequential steps.

Although an example in which the printed circuit board 3 is soldered with a mask plate 4 fitted thereon is shown, the process is the same when the printed circuit board 3 is soldered without the mask plate 4. The mask plate 4 may be made of a heat-resistant resin for repeated use and may be made of a hardening resin applied on the printed circuit board 3 for single use.

To lift up or down the fore end of the printed circuit board 3 with respect to the direction in which the printed circuit board 3 is transferred (the direction from the inlet opening 116 to the outlet opening 117), the second actuator 119 is controlled in the upward or downward direction. To lift up or down the rear end of the printed circuit board 3 with respect to the direction in which the printed circuit board 3 is transferred, the first actuator 118 is controlled in the upward or downward direction. To move the printed circuit board 3 horizontally, the rotational speed and direction of rotation of the motor (drive means 306) for driving the conveyor 107 are controlled.

The procedure for bringing the printed circuit board 3 into contact with the flat overflowing wave 6 is described below.

When the printed circuit board 3 is introduced into the soldering chamber 106*c* through the inlet opening 116 and transferred in the direction of arrow A as shown in FIG. 7(*a*) to a predetermined position, the fore end of the printed circuit board 3 is lifted down in the direction of arrow B as shown in FIG. 7(*b*) and the printed circuit board 3 is moved in the direction of arrow C.

When the fore end of the printed circuit board 3 contacts the flat overflowing wave 6 as a result of movement in the direction of arrow D as shown in FIG. 7(*c*), the rear end of the printed circuit board 3 is lifted down in the direction of arrow E until the entire lower surface (the surface to be soldered) of the printed circuit board 3 (mask plate) 4 contacts the flat overflowing wave 6. Moving the printed circuit board 3 as shown in FIG. 7(*a*) to FIG. 7(*c*) allows a gas between the printed circuit board 3 and the flat overflowing wave 6 to escape.

After that, the printed circuit board 3 is moved horizontally in the direction of arrow F (backward) as shown in FIG. 7(*d*) to apply a kinetic pressure from the molten solder 5 to the parts (regions) to be soldered on the printed circuit board 3 in order to improve the wettability of the parts (regions) to be soldered to the molten solder 5.

The procedure for separating the printed circuit board 3 from the flat overflowing wave 6 is next described.

As shown in FIG. 8(*a*), the fore end of the printed circuit board 3 is lifted up in the direction of arrow G and the printed circuit board 3 is moved in the direction of arrow H to cause the molten solder to peel back in order to adjust the shapes of fillets and to prevent a solder bridge.

After that, the printed circuit board 3 is moved in the direction of arrow I as shown in FIG. 8(*b*), and the rear end of the printed circuit board 3 is lifted up in the direction of arrow K as shown in FIG. 8(*c*). Finally, the printed circuit board 3 is transferred in the direction of arrow J out of the soldering chamber 6*c* through the outlet opening 117, and a series of steps to bring the printed circuit board 3 into contact with the molten solder 5, that is, the soldering operation is completed.

The controller 301 controls the feed rate of nitrogen gas to the soldering chamber 106*c* in response to vertical movement of the casing 106 (and the printed circuit board 3) shown in FIG. 1.

Figure 9A:
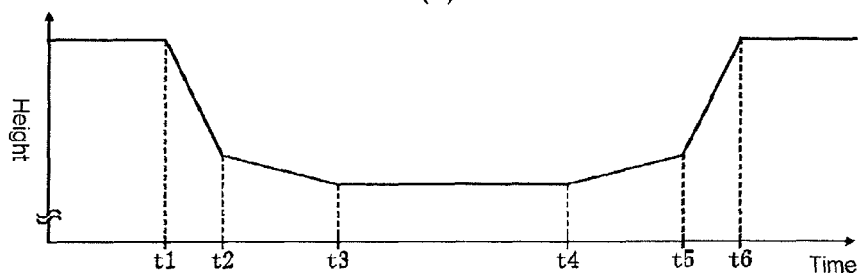
FIG. 9(a) to FIG. 9(e) and FIG. 10(a) to FIG. 10(c) are graphs for explaining the control of the feed rate of nitrogen gas to a soldering chamber in response to a change in volume of the soldering chamber caused by vertical movement of a casing shown in FIG. 1.
Figure 9B:
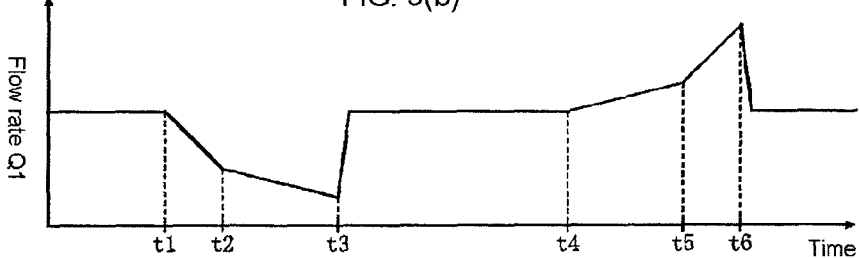
Figure 9C:
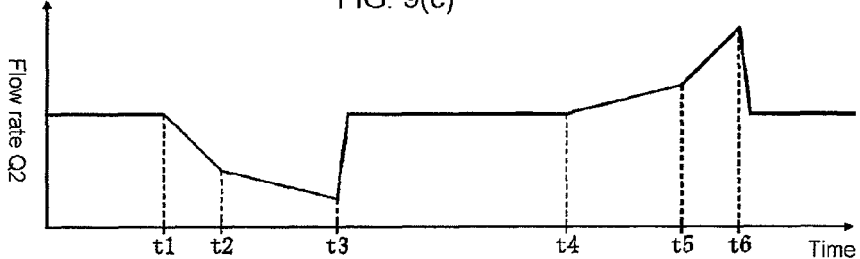
Figure 9D:
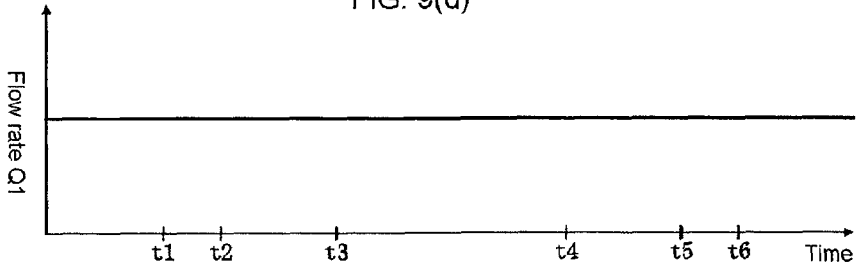
Figure 9E:
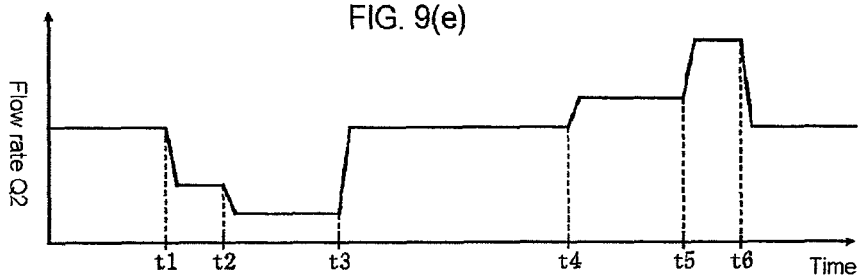
Figure 10A:
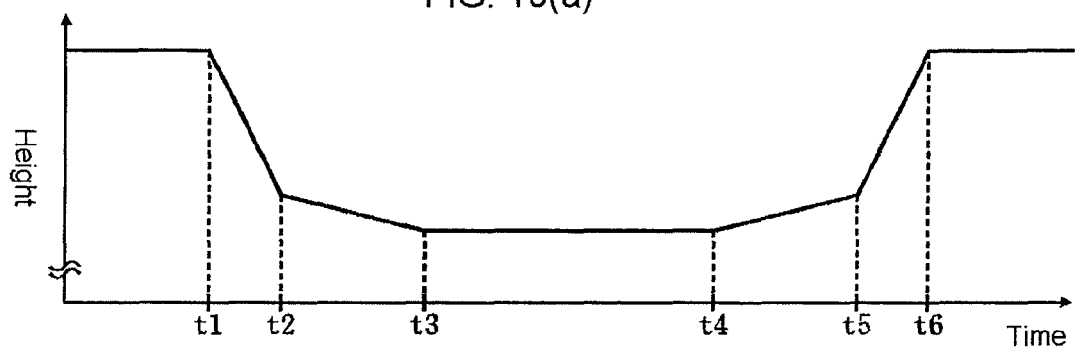

FIG. 9(*a*) to FIG. 9(*e*) and FIG. 10(*a*) to FIG. 10(*c*) are graphs for explaining the control of the feed rate of nitrogen gas to the soldering chamber 106*c*.

In FIG. 9(*a*) and FIG. 10(*a*), the horizontal axis represents the time t and the vertical axis represents the height or vertical position of the casing 106.

In FIG. 9(*b*) to FIG. 9(*e*) and FIG. 10(*b*) and FIG. 10(*c*), the horizontal axis represents the time t and the vertical axis represents the feed rate of nitrogen gas.

The horizontal axes of FIG. 9(*a*) to FIG. 9(*e*) correspond in time to each other, and the horizontal axes of FIG. 10(*a*) to FIG. 10(*c*) correspond in time to each other.

FIG. 9(*b*) and FIG. 9(*c*), as a pair, show one example of control of the nitrogen gas feed rate. The vertical axis of FIG. 9 (*b*) represents the feed rate Q1 of nitrogen gas to the second nozzle group 210 (four nozzles 114*e* to 114*h* (shown in FIG. 1) arranged in the vicinity of the solder vessel 109 in the soldering chamber 106*c*), and the vertical axis of FIG. 9 (*c*) represents the feed rate Q2 of nitrogen gas to the nozzle group 210 (four nozzles 114*a* to 114*d* (shown in FIG. 1) arranged in the vicinity of the inlet and outlet openings 116 and 117 of the casing 106).

In this example, the nitrogen gas feed rate is increased or decreased in proportion to the change in vertical position of the casing 106, and the feed rates of nitrogen gas to both the nozzle groups 209 and 210 are controlled similarly.

The nitrogen gas feed rate is decreased during the period from time t1 to time t3 when the casing 106 is being moved downward toward the lower position, and is increased during the period from time t4 to time t6 when the casing 106 is being moved upward toward the upper position. The nitrogen gas feed rate is maintained at a predetermined value during the period from time t3 to time t4 when the casing 106 is stationary.

During the period from time t1 to time t3 when the atmospheric gas in the soldering chamber 106*c* is discharged through the inlet and outlet openings 116 and 117, the nitrogen gas feed rate is decreased since outside atmosphere does not flow into the soldering chamber 106*c* even if the nitrogen gas feed rate is low. On the contrary, during the period from time t4 to time t6 when there is a possibility that outside atmosphere is sucked into the soldering chamber 106*c*, the nitrogen gas feed rate is increased to prevent outside atmosphere from flowing into the soldering chamber 106*c*. That is, the nitrogen gas feed rate is controlled to prevent gas communication between inside and outside the soldering chamber 106*c* in response to a change in volume of the soldering chamber 106 caused by the vertical movement of the casing 106.

By this control, the oxygen concentration in the soldering chamber 106*c* can be lowered without increasing the average of the nitrogen gas feed rate. Further, the oxygen concentration can be in a conventional level, even when the average of nitrogen gas feed rate is lowed.

FIG. 9(d) and FIG. 9(e) as a pair show an example (second example) of control of the nitrogen gas feed rate. The vertical axis of FIG. 9(d) and the vertical axis of FIG. 9(e) represent the feed rate Q1 of nitrogen gas to the second nozzle group 210 (nozzles 114e to 114h) and the feed rate Q2 of nitrogen gas to the first nozzle group (114a to 114d), respectively.

In this example, only the feed rate Q2 of nitrogen gas to the first nozzle group 209 (nozzles 114a to 114d (shown in FIG. 1) arranged in the vicinity of the inlet and outlet openings 116 and 117) is increased or decreased in accordance with the change in the vertical position of the casing 106, and the feed rate Q1 of nitrogen gas to the second nozzle group 210 (nozzles 114e to 114h (shown in FIG. 1) arranged in the vicinity of the solder vessel 10 in the casing 106) is not changed. That is, only the feed rate of nitrogen gas to the nozzle group having a good effect of preventing gas communication with outside atmosphere is controlled. In addition, the nitrogen gas feed rate Q2 is controlled stepwise in time.

Figure 10B:
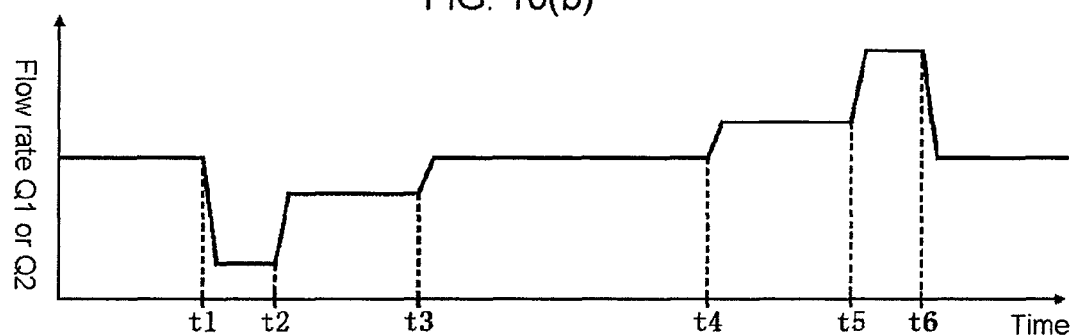
Figure 10C:
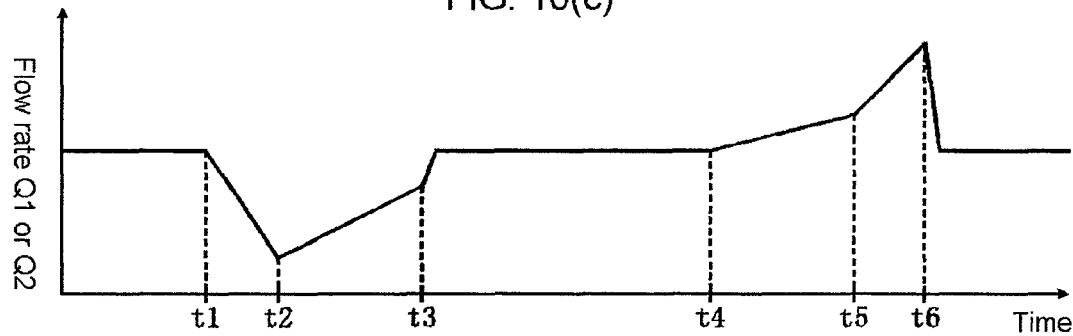

FIG. 10(b) and FIG. 10(c) show third and fourth examples, respectively, of control of the nitrogen gas feed rate. The vertical axes represent whichever of the nitrogen gas feed rate Q1 and Q2. That is, the third or fourth control example may be combined with the control examples shown in FIGS. 9(a) to 9(e).

FIG. 10(b) shows a control example in which the nitrogen gas feed rate is controlled in proportion to the speed of change in the vertical position of the casing 106, that is, the differential value of the speed of change in the volume of the soldering chamber 106c.

FIG. 10(c) shows a control example in which the control example shown in FIG. 10(b) and the control example shown in FIG. 9(b) are combined.

Also by these controls, the oxygen concentration in the soldering chamber 106c can be lowered even when the average of the nitrogen gas feed rate is low and can be maintained constant even when the average of nitrogen gas feed rate is low.

The above control charts are examples for illustrative purposes. The point is to select the optimum profile depending on the state of control of the vertical movement (profiles such as position and speed) of the casing 106 including the conveyor 107.

As described above, according to the soldering apparatus of this embodiment, flow-dip soldering of a printed circuit board can be carried out at a low feed rate, that is, with low consumption, of an inert gas such as nitrogen gas.

Consequently, flow-dip soldering of a printed circuit board having electronic parts with long leads mounted thereon can be carried out in an inert gas atmosphere.

In addition, since the inert gas feed rate can be low, the production cost does not exceed the normal production cost even when soldering in an inert gas atmosphere is involved. Further, the printed circuit board can be transferred at normal speed, the productivity is high.

Also, partial soldering can be carried out to solder electronic parts with long leads on a printed circuit board having been subjected to reflow soldering with the flow-dip soldering apparatus of the present invention when a mask plate having openings at positions corresponding to the regions to be soldered is fit on the printed circuit board.

Therefore, since all the regions on a printed circuit board to be soldered can be soldered simultaneously without using a soldering iron robot as in conventional apparatuses, the productivity can be significantly improved.

In addition, since normal flow-dip soldering and soldering using a mask plate can be carried out in one apparatus, even if the type of the printed circuit boards to be soldered is changed according to the production schedule, no lead time is required and the efficiency of the soldering can be maintained very high.

In the above embodiment described above, the feed rate of nitrogen gas is increased during a movement of the casing 106 to the upper position in order to prevent outside atmosphere from entering into the soldering chamber 106c through the inlet and outlet openings 116 and 117 (to prevent gas communication between inside and outside of the soldering chamber 106c). In another embodiment, the inlet and outlet openings 116 and 117 are closed by shutters only during a movement of the casing 106 to the upper position.

Figure 11A:
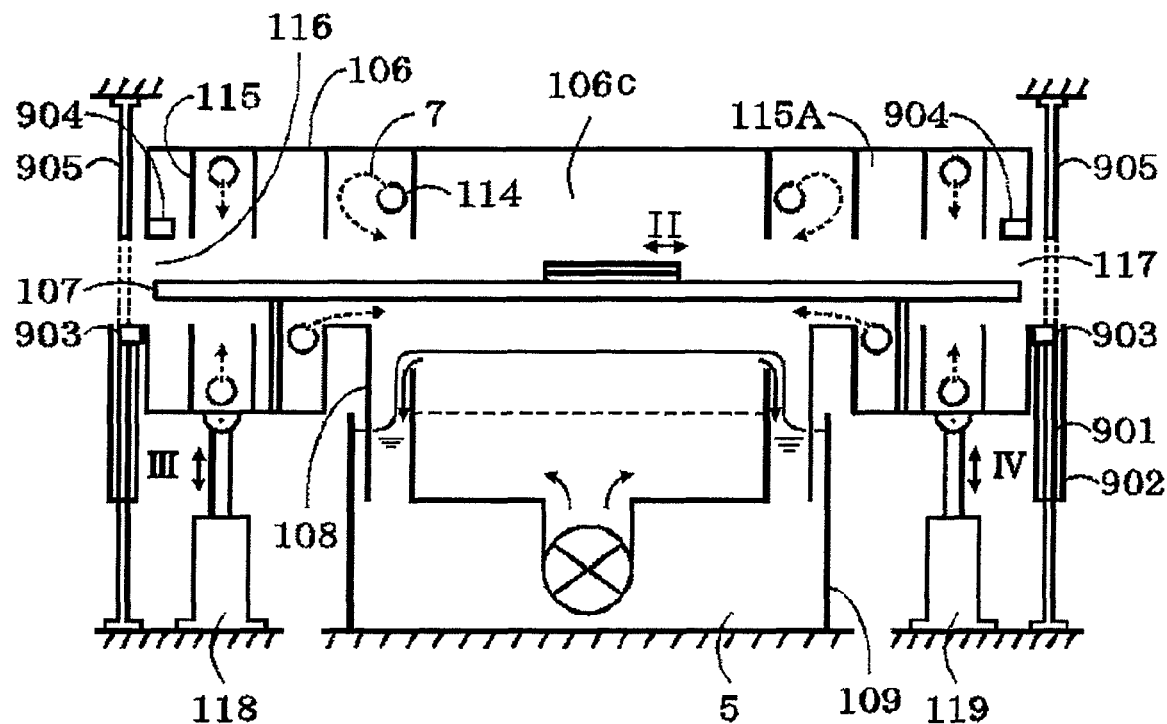
FIG. 11(a) is an elevational cross-sectional view schematically illustrating an embodiment in which an inlet opening and an outlet opening are able to be closed during movement of the casing to its upper position.
Figure 11B:
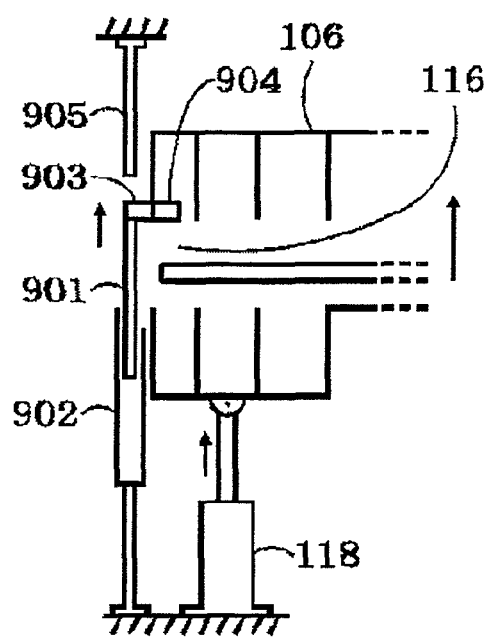
FIG. 11(b) is a fragmentary elevational cross-sectional view of FIG. 11(a) showing the state of the inlet opening closed with a shutter.

FIGS. 11(a) and 11(b) are cross-sectional views illustrating an embodiment in which the inlet and outlet openings 116 and 117 can be closed by shutters only during a movement of the casing 106 including the conveyor 107 to the upper position. The same parts as those in FIG. 1 are designated in FIGS. 11(a) and 11(b) by the same reference numerals.

As shown in FIG. 11(a), the soldering section 2 has shutter cases 902 with shutters 901 slidably received therein. The shutter cases 902 are disposed in contact with lower portions of the fore and rear ends 106a and 106b of the casing 106. Magnets 904 are attached at upper edges of the inlet and outlet openings 116 and 117 of the casing 106, and magnets 903 with polarity orientations opposing those of the magnets 904 are attached to the upper ends of the shutters 901.

Push rods 905 are provided right above the shutters 901 and extend to positions adjacent to upper edges of the inlet and outlet openings 116 and 117 of the casing 106 in the upper position.

In FIG. 11(a), the casing 106 is in the upper position to wait for the printed circuit board 3 to be transferred from the preheating section 1 onto the conveyor 107, and the upper ends of the shutters 901 are aligned with the lower edges of the inlet and outlet openings 116 and 117. When the casing 106 is moved to the lower position, the inlet and outlet openings 116 and 117 are closed by the shutter cases 902 and the magnets 904 at the upper edges of the inlet and outlet openings 116 and 117 stick to the magnet 903 of the shutters 901. Then, when the casing 106 is moved upward toward the upper position, the shutters 901 are drawn together with the casing 106 because of the magnetic binding of the magnets 903 and 904. Thus, the casing 106 is moved upward with the inlet and outlet openings 116 and 117 closed by the shutters 901. The state of the shutters 901 during movement of the casing 106 toward the upper position is shown in FIG. 10(b).

When the casing 106 reaches the upper position, the push rods 905 abut the upper ends of the shutters 901. Then, the shutters 901 are pushed down relative to the casing 106 and the magnets 903 and 904 are separated from each other to open the inlet and outlet openings 116 and 117.

As described above, the inlet and outlet openings 116 and 117 are closed during movement of the casing 106 toward the upper position when outside atmosphere tends to be sucked into the soldering chamber 106c since the volume of the soldering chamber 106c is expanded. Therefore, outside atmosphere is less likely to enter the soldering chamber 106c and a stable nitrogen gas atmosphere with a low oxygen concentration can be maintained in the soldering chamber 106c.

When the above constitution is combined with the beforementioned nitrogen gas feed rate control, the effect of the constitution is enhanced and the nitrogen gas feed rate can be significantly decreased.

Although the magnets 903 and 904 and push rods 905 are used to open and close the shutters 901 in this embodiment, the shutters 901 may be constituted of electronic shutters which can be controlled to open and close in response to the vertical movement of the casing 106 by the controller 301.

In the above embodiments, when the casing 106 including the conveyor 107 is moved up and down, the volume of the soldering chamber 106*c* is increased and decreased. In a further embodiment, the soldering section 2 is provided with a volume variable chamber in gas communication with the soldering chamber so that the increase or decrease in the volume of the soldering chamber caused by vertical movement of the casing 106 can be canceled.

Figure 12:
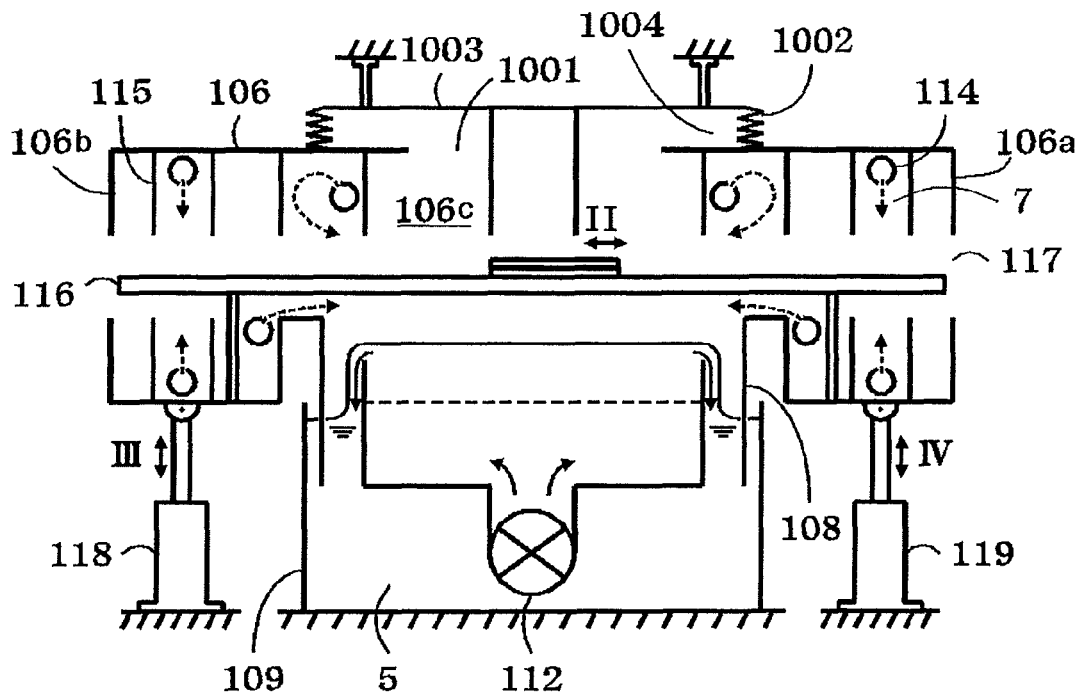
FIG. 12 is a cross-sectional view illustrating an embodiment provided with a volume variable chamber.

FIG. 12 is a cross-sectional view illustrating an embodiment provided with a volume variable chamber.

As shown in FIG. 12, the casing 106 has an upper opening 1001 with the same dimension as that of the lower opening 106*d* at its top, and a bellows 1002 extending contiguously upward from a whole marginal edge of the upper opening 1001. The upper end of the bellows 1002 is closed by a fixed plate 1003 with the same size as the upper opening 1001. The bellows 1002 and the fixed plate 1003 define a volume variable chamber 1004.

When the casing 106 is moved up and down, the bellows 1002 is expanded and contracted. The bellows 1002 is expanded to cancel the decrease in the volume of the soldering chamber 106*c* when the casing 106 is moved down, and the bellows 1002 is contracted to cancel the increase in the volume of the soldering chamber 106*c* when the casing 106 is moved up. Therefore, the total volume of the soldering chamber 106*c* and the volume valuable chamber 1004 is maintained substantially unchanged when the volume of the soldering chamber 106*c* is changed in response to the vertical movement of the casing 106.

As a result, gas communication does not occur between inside and outside the soldering chamber 106*c*, and the nitrogen gas atmosphere with a low oxygen concentration in the soldering chamber 106*c* can be maintained stably.

The soldering apparatus of the present invention can be applied to what is called Sylvania-type partial soldering. That is, Sylvania-type partial soldering can be carried out in a nitrogen gas atmosphere with a low oxygen concentration without increasing the volume of the soldering chamber.

In a Sylvania system, which is disclosed in, for example, GB Patent No. 801510, partial soldering is carried out by moving a printed circuit board close to a group of molten solder ejecting tubes arranged at positions corresponding to the regions to be soldered on the printed circuit board to bring the regions to be soldered into contact with the molten solder ejected from the tubes.

Figure 13:
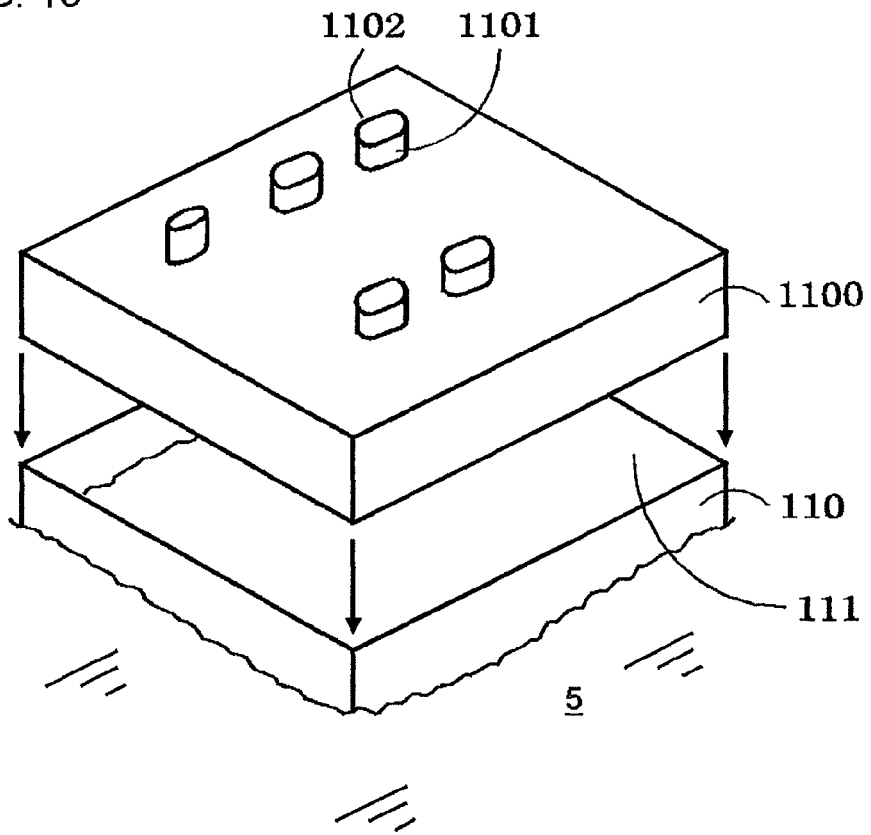
FIG. 13 is a perspective view of a part around a discharge opening of a constitution applicable to a Sylvania method.

FIG. 13 is a perspective view of a part around the discharge opening 111 of the solder-overflowing pot 110 shown in FIG. 1, illustrating the manner in which a cover 1100 having a plurality of ejection tubes 1101 over the discharge opening 111 of the solder-overflowing pot 110.

As shown in FIG. 13, since the cover 1100 fitted over the discharge opening 111 of the solder-overflowing pot 110 has a plurality of ejection tubes 1101 with discharge openings 1102 at their tops, the molten solder 5 is ejected from the discharge openings 1102 of the tubes 1101 to form solder waves 6 above the tubes 1101.

Since the positions of the discharge openings 1102 of the ejection tubes 1101 correspond to the regions to be soldered on the printed circuit board 3 as a work piece to be soldered, when the casing 106 is moved down with the printed circuit board 3 on the conveyor 107 (see FIG. 5), the regions to be soldered are brought into contact with the corresponding solder waves 6. Then, the molten solder 5 is supplied only onto the desired selected regions to be soldered and the regions to be soldered are soldered.

That is, partial soldering can be carried out without using a mask plate 4 as shown in FIG. 6.

With the soldering apparatus for carrying out flow-dip soldering in an atmosphere of an inert gas shown in FIG. 1, an oxygen concentration of 100 ppm or less is achieved in the soldering chamber 106*c* at the nitrogen gas feed rate of 400 litters/minute.

The figure is similar to that in a soldering apparatus employing the technology of the above-described Document 3, which indicates that the technology of the present invention is significantly effective.

In addition, when this constitution is combined with the nitrogen gas feed rate control as shown in FIG. 10(*b*), an oxygen concentration of 100 ppm or less is achieved in the soldering chamber 106*c* at a nitrogen gas feed rate of 380 litters/minute, which demonstrates the high performance of the soldering apparatus of the present invention.

As has been described previously, in the soldering apparatus of the present invention, a molten solder is caused to overflow from a discharge opening with a large dimension (a dimension greater than that of a flat work piece to be soldered) to form a flat overflowing wave of the molten solder above the discharge opening and a work piece having a plurality of regions to be soldered such as a printed circuit board having a plurality of electronic parts mounted thereon is brought into contact with the flat overflowing wave to solder the regions to be soldered simultaneously. In addition, the soldering apparatus of the present invention can carry out the soldering process in an inert gas atmosphere without increasing the inert gas feed rate. Therefore, an increase in production cost due to the use of a large amount of an inert gas can be prevented.

When soldering of a flat work piece is carried out with a mask plate having openings at target positions as shown in FIG. 6 fitted thereon, partial soldering by which the molten solder is supplied only onto the target regions, that is, the regions to be soldered, can be carried out. Such partial soldering is used to solder electronic parts which cannot be soldered by a reflow soldering method on a printed circuit board having been subjected to reflow soldering by supplying a molten solder on and around the portions to be soldered of the electronic parts.

The above description is illustrative and not restrictive. It should be understood that various change and modifications may be made depending on the applications and purposes.

The embodiments of the present invention have been described previously. The present invention can be embodied in the form of, for example, a system, device, method, program or storage medium. More specifically, the present invention may be applied to a system consisting of a plurality of devices or to an apparatus consisting of one device.

The controller 301 may perform the controls shown in FIGS. 7(*a*) to 7(*d*), FIGS. 8(*a*) to 8(*c*), FIGS. 9(*a*) to 9(*e*) and FIGS. 10(*a*) to 10(*c*) according to a program installed thereinto from outside. In this case, a group of information including the program may be provided from an external storage medium via a storage medium such as a CD-ROM, flash memory or FD or through a network.

A constitution in which the above embodiments are combined is included in the present invention.

Consequently, a soldering apparatus which can carry out flow-dip soldering at a low feed rate, that is, with low consumption, of an inert gas such as nitrogen gas can be realized.

Therefore, even when the electronic parts mounted on a printed circuit board have long leads or even when partial soldering using a mask plate is carried out, high quality soldering can be achieved at low costs. Also, partial soldering in an inert gas atmosphere with a low oxygen concentration can be carried out with high productivity.

On one hand, with miniaturization of electronic components and wide use of surface mounting parts, reflow soldering is widely used as a technology for soldering a printed circuit board. On the other hand, large-size electronic parts are used where the electronic circuit devices mounted on a printed circuit board are connected to external man-machine interfaces, and some of them, such as connectors, have long leads to be soldered.

To meet the demands of large-scale production, there is no way but to employ a flow-dip method to carry out soldering of such electronic parts with long leads to be soldered and large-size electronic parts. However, lead-free solders, which is widely used from the viewpoint of environmental protection, is inferior in wettability (solderability), therefore reliability, in ambient atmosphere, and soldering in an inert gas atmosphere with a low oxygen concentration is desired.

The soldering apparatus of the present invention, that is, an apparatus which can carry out flow-dip soldering in an inert gas atmosphere, meets the demands of the times. With the invented new soldering apparatus, high-quality electronic devices can be provided at low prices without causing any environmental pollution.

The present invention is characterized in that flow-dip soldering involving vertical movement of a printed circuit board can be carried out without increasing the volume of the soldering chamber.

With the soldering apparatus according to the present invention, since there is no need to move the printed circuit board vertically in the soldering chamber, flow-dip soldering can be carried out in an inert gas atmosphere with a low oxygen concentration without increasing the volume of the soldering chamber.

The soldering apparatus may further include means for adjusting the inert gas feed rate and means for controlling the means for adjusting the inert gas feed rate. The control means has a program or sequence which operates to decrease the feed rate of the inert gas during a movement of the casing toward the lower position and to increase the feed rate of the inert gas during a movement of the casing toward the upper position.

When the casing including the conveyor is moved downward, the volume of the soldering chamber is decreased and the inert gas in the soldering chamber is discharged through the inlet and outlet opening. Therefore, during this period, outside atmosphere does not enter the soldering chamber and the oxygen concentration in the soldering chamber does not increase even if the supply of inert gas to the soldering chamber is decreased or stopped.

When the casing including the conveyor is moved upward, the volume of the soldering chamber is increased and outside atmosphere tends to be sucked into the soldering chamber through the inlet opening and the outlet opening. However, during this period, outside atmosphere is prevented from entering the soldering chamber and the oxygen concentration in the soldering chamber does not increase when the feed rate of the inert gas to the soldering chamber is increased.

Since the inert gas feed rate is increased or decreased to prevent gas communication between inside and outside the soldering chamber (to cancel the increase and decrease in the volume of the soldering chamber), the entrance of outside atmosphere into the soldering chamber can be prevented with minimum consumption of the inert gas.

The soldering apparatus may further include a program or sequence for controlling the amount of the inert gas fed from the inert gas feeders to the soldering chamber in response to a change in volume of the soldering chamber caused by vertical movement of the casing. Then, unnecessary gas flow in the soldering chamber which may increase the oxygen concentration in the soldering chamber can be suppressed.

The soldering apparatus according to the present invention may further include shutters provided in the inlet and outlet openings to close the inlet and outlet openings during a movement of the casing toward the upper position. Then, gas communication with an outside atmosphere through the inlet opening and the outlet opening of the casing can be significantly reduced.

The soldering apparatus according to the present invention may further include a volume variable chamber whose volume can be changed in inverse proportion to the volume of the soldering chamber when the casing including the conveyor is moved upward or downward. Then, the changes in the volume of the soldering chamber can be cancelled, and gas communication with an outside atmosphere through the inlet opening and the outlet opening of the casing can be prevented.

The invention claimed is:

1. An apparatus for soldering a flat work piece having a lower surface to be soldered, comprising:
   a solder vessel containing a molten solder;
   a solder-overflowing pot disposed in said solder vessel and having a discharge opening above a surface level of the molten solder, said solder-overflowing pot being configured to form a flat overflowing wave of the molten solder above said discharge opening, said discharge opening having a dimension greater than that of the work piece so that entire lower surface of the work piece can simultaneously contact with a surface of said flat overflowing wave;
   a casing extending above said solder vessel from a rear end to a fore end and defining therewithin a soldering chamber, said casing having an inlet opening at said rear end to permit the work piece to enter said soldering chamber therethrough and an outlet opening at said fore end to permit the work piece to exit said soldering chamber therethrough, said casing having a lower opening facing said discharge opening of said solder-overflowing pot, said casing having a skirt extending contiguously downward from a whole marginal edge of said lower opening to surround said solder-overflowing pot, said skirt cooperating with said molten solder-containing vessel to seal said soldering chamber such that the soldering chamber is permitted to be in gas communication with an outside atmosphere only through said inlet and outlet openings;
   a plurality of baffle plates, arranged in respective sections proximate to the inlet opening and the outlet opening, forming respective labyrinth sealed sections;
   a conveyor disposed within said soldering chamber and physically integrated with said casing for movement therewith, said conveyor being operable for transferring the work piece between said inlet opening and said outlet opening;
   one or more inert gas feeders for feeding an inert gas to said soldering chamber;
   drive means operable to vertically move said integrated conveyor and casing between an upper position in which the work piece can be received by said conveyor through said inlet opening and can be discharged from said conveyor through said outlet opening and a lower position in which the work piece can contact with the surface of said flat overflowing wave during the positioning thereof above said discharge opening;

a controller for controlling the operation of said drive means and the operation of said conveyor so that the work piece is received through said inlet opening by said conveyor in said upper position, contacted with the surface of said flat overflowing wave during the positioning thereof above said discharge opening by said conveyor in said lower position and discharged through said outlet opening from said soldering chamber by said conveyor in said upper position; and a volume variable chamber in gas communication with said soldering chamber, a volume of said volume valuable chamber being variable such that a total volume of said soldering chamber and said volume valuable chamber is maintained substantially unchanged when the volume of said soldering chamber is changed in response to the vertical movement of said casing.

2. An apparatus as claimed in claim 1, wherein said drive means comprises a first actuator operatively connected to said casing at a position adjacent to said fore end for vertically displacing said fore end, and a second actuator operatively connected to said casing at a position adjacent to said rear end for vertically displacing said rear end, and wherein said controller independently control said first and second actuators such that the work piece may land on and take off from a surface of the solder wave in any desired tilted state.

3. An apparatus as claimed in claim 1, wherein said controller is configured to further control the feed rate of the inert gas fed from said inert gas feeder to said soldering chamber in response to a change in volume of said soldering chamber caused by vertical movement of said casing.

4. An apparatus as claimed in claim 3, wherein said controller is configured to increase the feed rate of the inert gas when the volume of said soldering chamber increases and to decrease the feed rate of the inert gas when the volume of said soldering chamber decreases.

5. An apparatus as claimed in claim 1, further comprising shutters provided in said inlet and outlet openings to close said inlet and outlet openings during a movement of said casing toward said upper position.

6. An apparatus as claimed in claim 1, further comprising a case disposed in juxtaposition to said casing and defining a preheating chamber therewithin, a heater disposed in said preheating chamber, and a conveying device disposed in said preheating chamber to transfer the work piece therethrough to said inlet opening of said casing, so that the work piece is preheated during passage thereof though said preheating chamber and introduced into said soldering chamber through said inlet opening.

7. An apparatus as claimed in claim 1, wherein said skirt has a lower end immersed in the molten solder below the surface level of the molten solder, so that said soldering chamber may be in gas communication with ambient air only through said inlet and outlet openings.

* * * * *